United States Patent
Choo et al.

(10) Patent No.: US 10,741,621 B2
(45) Date of Patent: Aug. 11, 2020

(54) DISPLAY DEVICE WITH A FINGERPRINT SENSOR

(71) Applicant: LG DISPLAY CO., LTD., Seoul (KR)

(72) Inventors: Kyoseop Choo, Suwon-si (KR); Buyeol Lee, Goyang-si (KR); Jonghee Hwang, Goyang-si (KR); Guensik Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/818,027

(22) Filed: Nov. 20, 2017

(65) Prior Publication Data

US 2018/0151641 A1    May 31, 2018

(30) Foreign Application Priority Data

Nov. 25, 2016 (KR) .......................... 10-2016-0158471
Apr. 26, 2017 (KR) .......................... 10-2017-0053800

(51) Int. Cl.

| H01L 27/32 | (2006.01) |
| H01L 51/52 | (2006.01) |
| H01L 51/00 | (2006.01) |
| G06K 9/00 | (2006.01) |
| H04M 1/02 | (2006.01) |
| H04M 1/67 | (2006.01) |

(52) U.S. Cl.
CPC ........ H01L 27/3234 (2013.01); G06K 9/0002 (2013.01); G06K 9/0004 (2013.01); H01L 27/323 (2013.01); H01L 51/0097 (2013.01); H01L 51/5237 (2013.01); H01L 51/5281 (2013.01); H04M 1/0266 (2013.01); *H01L 2251/5338* (2013.01); *H04M 1/026* (2013.01); *H04M 1/67* (2013.01)

(58) Field of Classification Search
CPC ................ G06K 9/0002; G06K 9/0004; H01L 2251/5338; H01L 27/323; H01L 27/3234; H01L 51/0097; H01L 51/5281; H01L 51/5237; H04M 1/026; H04M 1/0266; H04M 1/67

See application file for complete search history.

(56) References Cited

U.S. PATENT DOCUMENTS

| 6,327,376 B1 * | 12/2001 | Harkin ................... G01B 7/004 356/71 |
| 9,092,094 B1 * | 7/2015 | Baldwin ............... G06F 3/0425 |
| 2004/0252867 A1 | 12/2004 | Lan et al. |
| 2006/0039050 A1 | 2/2006 | Carver et al. |

(Continued)

FOREIGN PATENT DOCUMENTS

| CN | 1251650 A | 4/2000 |
| CN | 104751121 A | 7/2015 |

(Continued)

*Primary Examiner* — Kim Y Vu
*Assistant Examiner* — Michael J Vanchy, Jr.
(74) *Attorney, Agent, or Firm* — Birch, Stewart, Kolasch & Birch, LLP

(57) ABSTRACT

Disclosed is a display device including a display panel configured to be situated under a transparent substrate and display an image on a display area toward the transparent substrate, a fingerprint sensor under the display panel to detect a fingerprint contacting the transparent substrate, and a drive integrated circuit (drive IC) configured to drive the display panel.

20 Claims, 15 Drawing Sheets

(56) References Cited

U.S. PATENT DOCUMENTS

| | | | |
|---|---|---|---|
| 2013/0140965 A1* | 6/2013 | Franklin | G06F 1/1626 312/223.1 |
| 2014/0056028 A1* | 2/2014 | Nichol | G02B 6/0028 362/611 |
| 2014/0140588 A1* | 5/2014 | Chou | G06K 9/0002 382/124 |
| 2014/0355376 A1 | 12/2014 | Schneider et al. | |
| 2015/0036065 A1 | 2/2015 | Yousefpor et al. | |
| 2015/0070840 A1* | 3/2015 | Rappoport | G06F 1/1633 361/679.56 |
| 2016/0181345 A1 | 6/2016 | Lee et al. | |
| 2016/0234362 A1* | 8/2016 | Moon | H04M 1/0202 |
| 2017/0300736 A1* | 10/2017 | Song | G06K 9/00033 |
| 2018/0046837 A1* | 2/2018 | Gozzini | G06K 9/0004 |

FOREIGN PATENT DOCUMENTS

| | | |
|---|---|---|
| JP | 2006-305154 A | 11/2006 |
| JP | 2009-3821 A | 1/2009 |
| JP | 2011-13760 A | 1/2011 |
| JP | 2012-70356 A | 4/2012 |
| JP | 2015-38859 A | 2/2015 |
| TW | 201321834 A1 | 6/2013 |
| TW | 201414262 A | 4/2014 |
| WO | WO 2015/192630 A1 | 12/2015 |
| WO | WO 2016/093476 A1 | 6/2016 |
| WO | WO 2016/154378 A1 | 9/2016 |

\* cited by examiner

SLS $T_{CP\_AIR} < \alpha < T_{VHOE\_LR} < \theta$ ex) $45° < \alpha < 55°$
$70° < \theta < 75°$

DISPLAY DEVICE WITH A FINGERPRINT SENSOR

CROSS-REFERENCE TO RELATED APPLICATION

This application claims the priority benefit of Korean Patent Application Nos. 10-2017-0053800 filed on Apr. 26, 2017 and 10-2016-0158471 filed on Nov. 25, 2016, which are incorporated herein by reference for all purposes as if fully set forth herein.

BACKGROUND OF THE INVENTION

Field of the Invention

Embodiments of the present invention relate to a display device with a fingerprint sensor on a screen.

Discussion of the Related Art

With the advance of computer technology, computer-based systems for various purposes, such as laptop computers, table PCs, smartphones, personal digital assistants, automated teller machines, search guidance systems, etc., have been developed. These systems usually store a lot of confidential data such as business information or trade secrets, as well as personal information about the private lives of individuals, there is a need to strengthen security to protect this data.

To this end, in the conventional art, there have been proposed methods to strengthen security by using a sensor for sensing biometric information. A known example of this is a fingerprint sensor which can strengthen security by registering or authenticating with a system via a fingerprint. A fingerprint sensor is a sensor that detects a human fingerprint. Fingerprint sensors can be categorized into optical fingerprint sensors, capacitive fingerprint sensors, ultrasonic sensors, etc.

Generally, a fingerprint sensor is placed in a specific area, like the Home button, outside the screen. The fingerprint sensor may be placed in a bezel area outside the screen, in which instance the bezel area is wider. A display panel's structure may be altered to place a fingerprint sensor on the display panel.

A fingerprint sensor may be placed on a liquid crystal display device (LCD). The fingerprint sensor is visible when situated between the display panel and a backlight unit (BLU), in a screen area. A prism sheet in the backlight unit BLU has many air gaps due to its structure, and this makes it difficult to place a fingerprint sensor, especially, an ultrasonic fingerprint sensor, under the display panel.

SUMMARY OF THE INVENTION

Accordingly, the present invention is directed to a display device with a fingerprint sensor which is capable of detecting fingerprint on a screen, without increasing bezel size or altering display panel structure.

An example embodiment of the present invention provides a display device including a transparent substrate, a display panel configured to be situated under the transparent substrate and display an image on a display area toward the transparent substrate, a fingerprint sensor under the display panel to detect a fingerprint contacting the transparent substrate, and a drive integrated circuit (drive IC) configured to drive the display panel.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
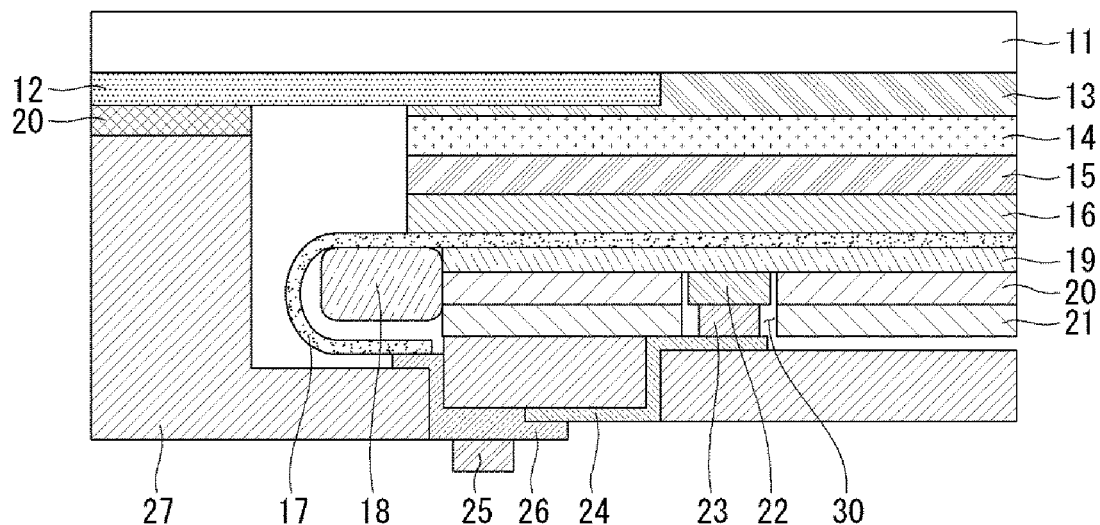
FIG. 1 is a cross-sectional view of a display device according to a first example embodiment of the present invention.

A display device according to the example embodiments of the present invention may be implemented based on a self-luminous device such as an electroluminescent display. Electroluminescent displays may be largely classified into inorganic light-emitting displays and organic light-emitting displays. Pixels of an active matrix type organic light-emitting display emit light using organic light-emitting diodes (hereinafter, "OLED").

The various aspects and features of the present invention and methods of accomplishing the same may be understood more readily by reference to the following detailed descriptions of example embodiments and the accompanying drawings. The present invention may, however, be embodied in many different forms and should not be construed as being limited to the example embodiments set forth herein. Rather, these example embodiments are provided so that this disclosure will be thorough and complete and will fully convey the concept of the present invention to those skilled in the art, and the present invention is defined by the appended claims.

The shapes, sizes, proportions, angles, numbers, etc. shown in the figures to describe the example embodiments of the present invention are merely examples and not limited to those shown in the figures. Like reference numerals denote like elements throughout the specification. In describing the present invention, detailed descriptions of related well-known technologies will be omitted to avoid unnecessary obscuring the present invention. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present invention.

Like reference numerals denote like elements throughout the specification.

The features of various example embodiments of the present invention may be combined with one another either partly or wholly, and may technically interact or work together in various ways. The example embodiments may be carried out independently or in combination with one another.

Hereinafter, various example embodiments of the present invention will be described in detail with reference to the accompanying drawings. In the following example embodiments, descriptions will be made with respect to an organic light-emitting display as an example of an electroluminescent display. However, it should be noted that the technical spirit of the present invention is not limited to organic light-emitting displays but can be applied to inorganic light-emitting displays including inorganic light-emitting materials.

FIG. 1 is a cross-sectional view of a display device according to a first example embodiment of the present invention. All components of the display device according to all embodiments of the present invention are operatively coupled and configured.

Referring to FIG. 1, a display panel 14, 15, 16, 17, and 19 for displaying an image on a display area, a fingerprint sensor 23 situated under the display panel 14, 15, 16, 17, and 19 for sensing a fingerprint on the display area, and a drive integrated circuit (hereinafter, "IC") 25 for driving the display panel 14, 15, 16, 17, and 19. A transparent substrate 11 covering the display area, with which a fingerprint comes into contact, is disposed on the display panel 14, 15, 16, 17, and 19. The fingerprint sensor 23 is disposed on the display area to detect a fingerprint pattern on the display area.

The fingerprint sensor 23 is situated opposite the display panel 14, 15, 16, 17, and 19. The fingerprint sensor 23 is disposed on the display panel 14, 15, 16, 17, and 19 in the opposite side of a contact position of user's fingerprint with the substrate therebetween.

The display panel 14, 15, 16, 17, and 19 may be, but is not limited to, a flexible display panel of a flexible display device such as a plastic OLED display. In the plastic OLED display, the display panel 14, 15, 16, 17, and 19 comprises a back plate 19, an organic thin film 17 bonded onto the back plate 19, the display area formed on the organic thin film 17, a touch sensor array 15 placed on the display area, and a polarizing film 14 bonded onto the touch sensor array 15. The display area is a screen comprising a pixel array 16 that displays an image.

The polarizing film 14 improves outdoor visibility by preventing reflection of external light on the display panel 14, 15, 16, 17, and 19. The polarizing film 14 may comprise a circular polarizer (or $\lambda/4$ plate). The polarizing film 14 is bonded onto the transparent substrate 11 with an adhesive 13, for example, an optical clear adhesive OCA.

The back plate 19 may be a PET (polyethylene terephthalate) substrate. The back plate 19 prevents moisture permeation to keep the pixel array 16 from getting exposed to humidity and supports the pixel array 16. The organic thin film 17 may be a thin PI (polyimide) film substrate. Multiple buffer layers, which are insulating materials that are not shown, may be formed on the organic thin film 17. Wiring lines for supplying power or signals applied to the pixel array 16 and the touch sensor array 15 may be formed on the organic thin film 17.

The pixel array 16 comprises data lines, gate lines intersecting the data lines, and pixels arranged in a matrix to make up a screen that reproduces an input image. Each pixel comprises a light-emitting element. In an example, each pixel may comprise an OLED and a drive circuit for the OLED. The data lines on the pixel array 16 are connected to the drive IC 25 and receive data signals from the drive IC 25. The touch sensor array 15 is driven by a touch sensor driver to detect touch input, and transmits the coordinates and identification code (ID) of each touch input to a host system.

The fingerprint sensor module 23 is mounted on a first flexible substrate 24. The fingerprint sensor module 23 may be implemented as an optical fingerprint sensor which detects a fingerprint pattern by using the difference in the amount of light reflected from fingerprint ridges and valleys. The optical fingerprint sensor may include an image sensor such as CCD (charged couple device) or CIS (CMOS image sensor). The optical fingerprint sensor, when in fingerprint recognition mode, is able to detect a fingerprint pattern using light that is produced by the pixel array 16, projected towards the transparent substrate 11, and reflected from the fingerprint. The optical fingerprint sensor may detect a fingerprint pattern by using light received from a directional light source device SLS including the transparent substrate 11, rather than by using the pixels as light sources.

The fingerprint sensor module 23 may detect a fingerprint pattern by using an ultrasonic fingerprint sensor. The ultrasonic fingerprint sensor may detect a fingerprint pattern by transmitting ultrasonic waves towards the transparent substrate 11 using an ultrasonic transmitter and analyzing the ultrasonic waves reflected from the ridges and valleys of the fingerprint.

Such a fingerprint sensor module 23 is able to detect a fingerprint pattern without affecting bezel size, since it is situated under the pixel array 16 without making an alteration to the display panel's structure.

A receiving portion of the fingerprint sensor 23 is situated opposite the display panel to face the transparent substrate 11. The receiving portion comprises a detector plane where a fingerprint pattern is detected. The fingerprint sensor module 23 is bonded to the display panel 14, 15, 16, 17, and 19 so that the receiving portion of the fingerprint sensor module 23 faces the transparent substrate 11. The presence of air gaps between the fingerprint sensor module 23 and the display panel may significantly deteriorate sensor performance or make fingerprint sensing impossible. Accordingly, the receiving portion of the fingerprint sensor module 23 is bonded to the back plate 19 of the display panel with an adhesive 22. The adhesive 22 may be an optical clear adhesive (OCA), a pressure sensitive adhesive (PSA), etc.

A foam pad 20 and a metallic layer 21 may be stacked on the back plate 19 of the display panel 14, 15, 16, 17, and 19. The foam pad 20 is made of a foam resin and absorbs vibration or impact. The metallic layer 21 is a layer of metal, for example, Cu, that blocks electromagnetic interference (EMI).

A hole 30 exposing the back plate 19 is formed in the foam pad 20 and the metallic layer 21 so that the fingerprint sensor module 23 is bonded to the back plate 19. The fingerprint sensor module 23 is placed within the hole 30, with its receiving portion bonded to the back plate 19. A mid-frame 27 may have a hole exposing the hole in which the fingerprint sensor module 23 is inserted.

Since the fingerprint sensor 23 is buried in the hole 30 formed in the foam pad 20 and the metallic layer 21, the distance between a fingerprint on the transparent substrate 11 and the fingerprint sensor 23 may be reduced. The buried structure of the fingerprint sensor 23 may increase the efficiency of ultrasonic or light reception and thus improve fingerprint sensing performance.

The drive IC 25 drives the pixels by converting data of an input image to a data signal and outputting it to the data lines on the pixel array. The drive IC 25 may include a touch sensor driver. The drive IC 25 is mounted on a second flexible substrate 26.

Figure 8:
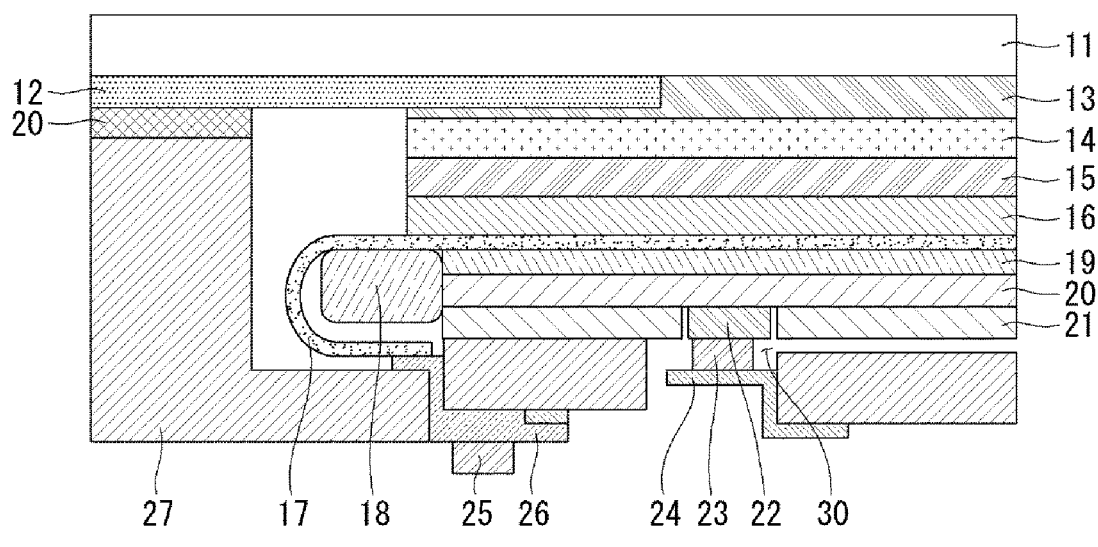
FIG. 8 is a cross-sectional view of a display device according to a seventh example embodiment of the present invention.
Figure 8:
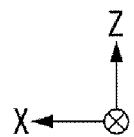
Figure 9:
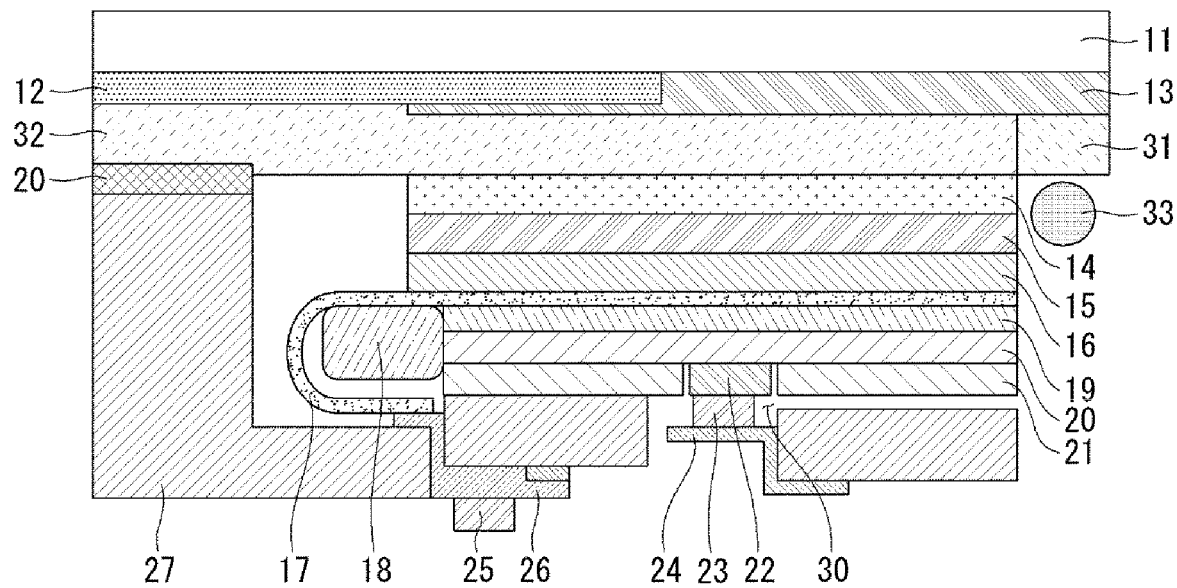
FIG. 9 is a cross-sectional view of a display device according to an eighth example embodiment of the present invention.

One end of the first flexible substrate 24 is connected to the fingerprint sensor module 23 on the inner side of the bottom of the mid-frame 27. The other end of the first flexible substrate 24 is exposed to the outer side of the bottom of the mid-frame 27 through a first hole of the mid-frame 27. The other end of the first flexible substrate 24 is connected to the second flexible substrate 26. The first and second flexible substrates 24 and 26 each may be implemented as an FPCB (flexible printed circuit board). The first and second flexible substrates 24 and 26 may be separated from each other, as shown in FIGS. 8 and 9, if they do not need to be synchronized or aligned.

The mid-frame 27 may be made with resin such as plastic. The mid-frame 27 accommodates the display panel 14, 15, 16, 17, and 19, the fingerprint sensor module 23, the drive IC 25, etc. The top of a sidewall of the mid-frame 27 may be bonded to the transparent substrate 11 with a double-sided tape 20. A decorative film 12 may be bonded to the transparent substrate 11. Image, logo, text, etc. may be printed on the decorative film 12.

One end of the organic thin film 17 is bent towards the rear of the display panel and connected to one end of the second flexible substrate 26. A mandrel 18 is bonded to the sides of the back plate 19 and foam pad 20 and supports the bent portion of the organic thin film 17.

The other end of the second flexible substrate 26 is exposed to the outer side of the bottom of the mid-frame 27 through a second hole of the mid-frame 27 and connected to the other end of the first flexible substrate 24. The drive IC 25 is mounted on the second flexible substrate 26 which is exposed through the bottom of the mid-frame 27.

Figure 3:
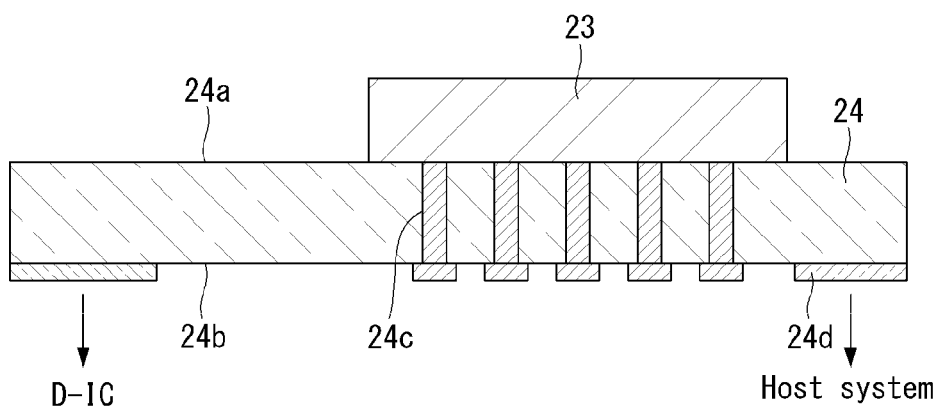
FIG. 3 is a cross-sectional view of an example in which via holes are formed in a first flexible substrate shown in FIGS. 1 and 2.
Figure 3:
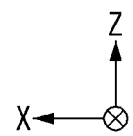

As shown in FIG. 3, the first flexible substrate 24 may have a plurality of via holes. The fingerprint sensor module 23 is mounted on a first side 24a of the first flexible substrate 24, and wiring lines 24d connected to the drive IC 25 and/or the host system's mainboard are formed on a second side 24b opposite to the first side 24a. A metal filler 24c filled in the via holes connects the fingerprint sensor module 23 to the wiring lines 24d, thereby connecting the fingerprint sensor module 23 to the host system's mainboard and/or the drive IC 25. The host system is connected to the fingerprint sensor module 23 through the first flexible substrate 24 to exchange data with the fingerprint sensor module 23 and control the fingerprint sensor module 23.

The host system may be any one of the following: a television system, a set-top box, a navigation system, a personal computer (PC), a home theater system, a mobile system, a wearable system, and a virtual reality system. The host system transmits pixel data of an input image to the drive IC 25. The host system executes an application linked to coordinates from the touch sensor driver, and performs user authentication based on fingerprint information received from the fingerprint sensor module 23.

The display panel 14, 15, 16, 17, and 19 may be implemented as an OLED display which is formed on a glass substrate. In this instance, the back plate 19 and the organic thin film 17 may be replaced with one glass substrate.

A fingerprint sensor is bonded to the underside of the display panel 14, 15, 16, 17, and 19 without making an alteration to the display panel 14, 15, 16, 17, and 19. The fingerprint sensor module 23 is placed on the pixel array of the display panel 14, 15, 16, 17, and 19. The fingerprint sensor module 23 is not visible by a user when an image is displayed, because the pixel array 16 displays the input image as the OLEDs emit light.

Figure 2:
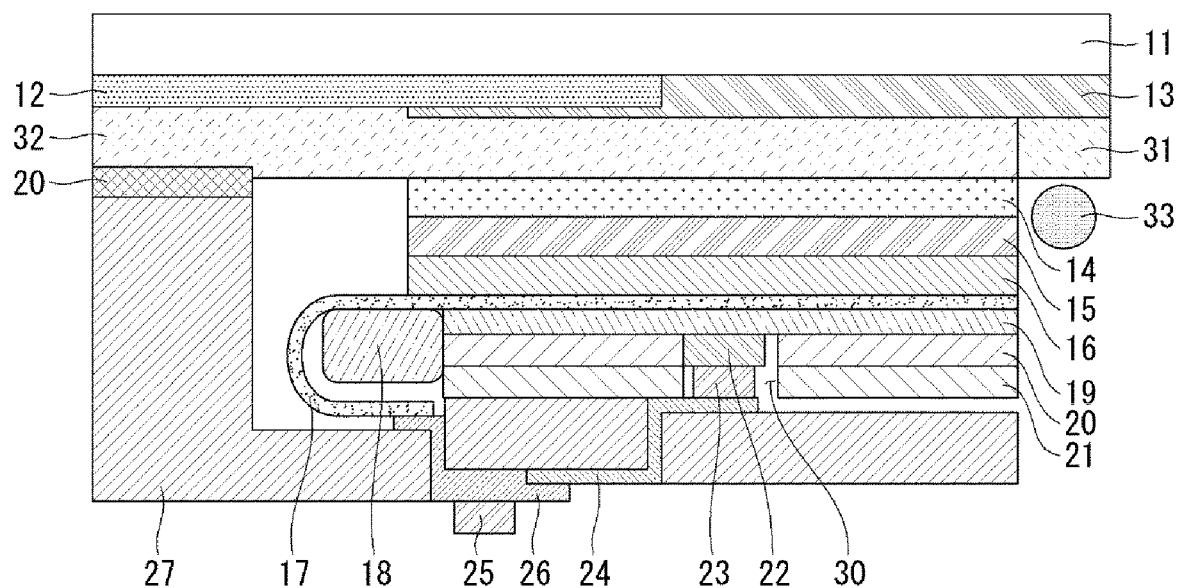
FIG. 2 is a cross-sectional view of a display device according to a second example embodiment of the present invention.

FIG. 2 is a cross-sectional view of a display device according to a second example embodiment of the present invention. Components substantially identical to those in the example embodiment of FIG. 1 are denoted by the same reference numerals, and detailed descriptions of them will be omitted, or may be briefly discussed.

Referring to FIG. 2, a display device of this invention further comprises a directional light controller 31, 32, and 33 placed between the transparent substrate 11 and the display panel 14, 15, 16, 17, and 19. The directional light controller 31, 32, and 33 comprises a light source 33, a light-entering element 31, and a light-exiting element 32. The directional light controller 31, 32, and 33 may further comprise a low refractive index layer.

The light source 33 is placed under one edge of the transparent substrate 11. The light-entering element 31 and the light-exiting element 32 are placed between the transparent substrate 11 and the display panel 14, 15, 16, 17, and 19. The light-entering element 31 and the light-exiting element 32 are bonded to the transparent substrate 11, and the polarizing film 14 of the display panel 14, 15, 16, 17, and 19 is bonded to the light-exiting element 32.

Light from the light source 33 is refracted at an angle of total reflection within the transparent substrate 11 and propagates within the transparent substrate 11. The light-exiting element 32 adjusts the angle of part of the light that is totally reflected within the substrate. The light, with its angle of total reflection narrowed by the light-exiting element 32, may be reflected from the top of the transparent substrate 11, pass through the low refractive index layer, and be projected to the receiving portion of the optical fingerprint sensor. The light-entering element 31 and the light-exiting element 32 may be implemented as an optical device including a holographic pattern.

Other components than the directional light controller 31, 32, and 33 are substantially identical to those of the foregoing example embodiment of FIG. 1.

Figure 4:
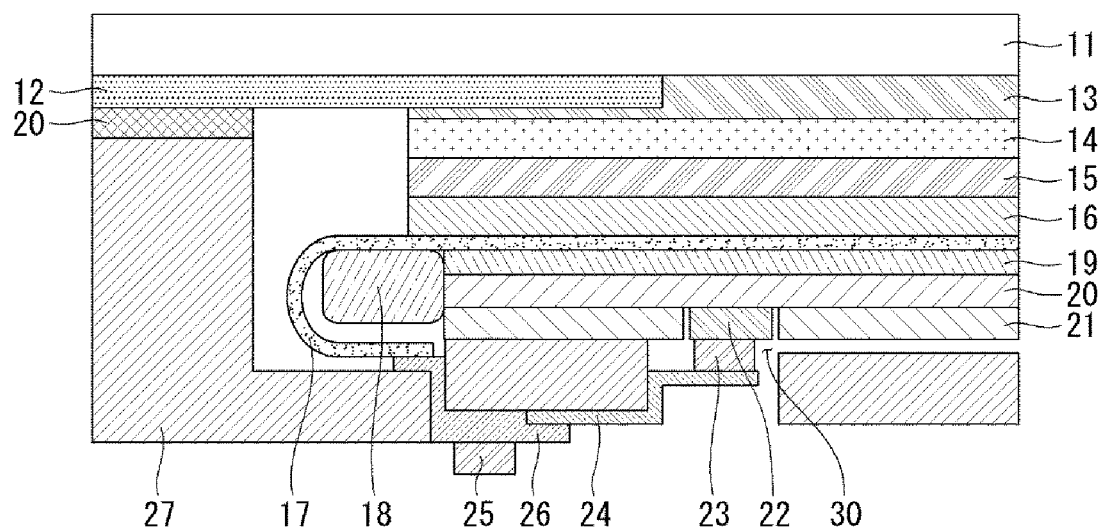
FIG. 4 is a cross-sectional view of a display device according to a third example embodiment of the present invention.
Figure 4:
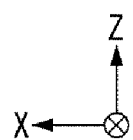

FIG. 4 is a cross-sectional view of a display device according to a third example embodiment of the present invention. Components substantially identical to those in the example embodiment of FIG. 1 are denoted by the same reference numerals, and detailed descriptions of them will be omitted, or may be briefly discussed.

Referring to FIG. 4, this example embodiment is substantially identical to the above first example embodiment, except that the fingerprint sensor module 23 is bonded to the foam pad 20. The metallic layer 21 has a hole for inserting the fingerprint sensor module 23. The foam pad 20 has no hole for inserting the fingerprint sensor module.

Since the foam pad 20 is an organic material, it does not interfere with ultrasonic propagation when the fingerprint sensor module 23 is implemented as an ultrasonic fingerprint sensor. When the fingerprint sensor module 23 is implemented as an ultrasonic fingerprint sensor, it is desirable that an organic material with high transparency is used as the foam pad 20 so as to keep the foam pad 20 from absorbing light received by the fingerprint sensor module 23.

Figure 5:
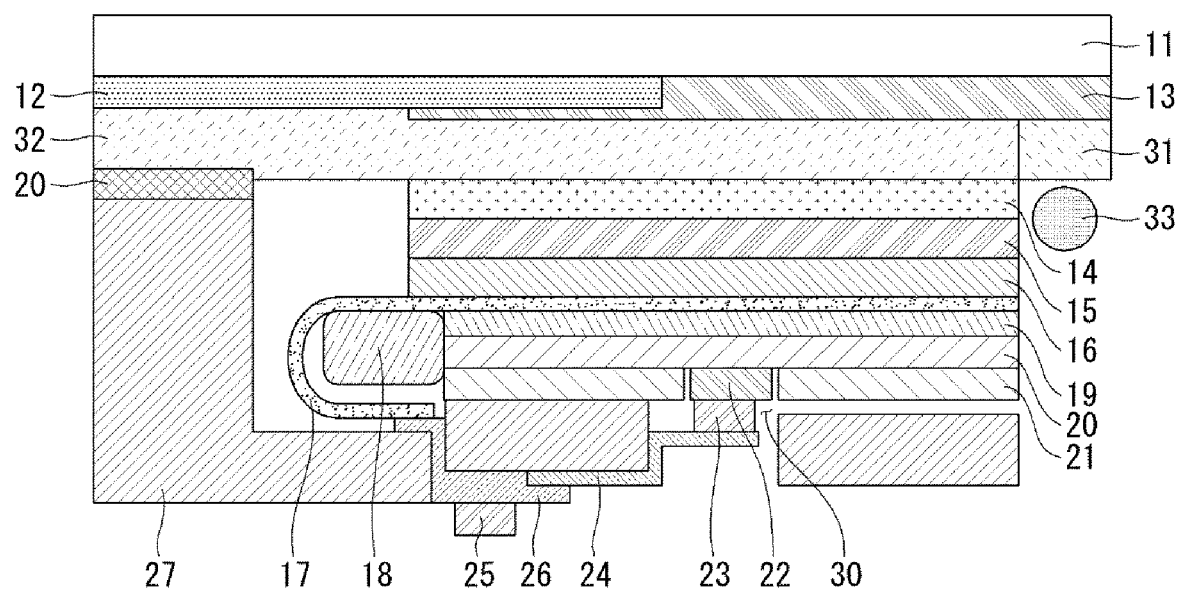
FIG. 5 is a cross-sectional view of a display device according to a fourth example embodiment of the present invention.

FIG. 5 is a cross-sectional view of a display device according to a fourth example embodiment of the present invention. Components substantially identical to those in the example embodiments of FIG. 4 are denoted by the same reference numerals, and detailed descriptions of them will be omitted, or may be briefly discussed.

Referring to FIG. 5, a display device of this invention further comprises a directional light controller 31, 32, and 33 placed between the transparent substrate 11 and the display panel 14, 15, 16, 17, and 19. The directional light controller 31, 32, and 33 comprises a light source 33, a light-entering element 31, and a light-exiting element 32. The directional light controller 31, 32, and 33 may further comprise a low refractive index layer. The directional light controller 31, 32, and 33 is substantially identical to that shown in FIG. 2.

Figure 6:
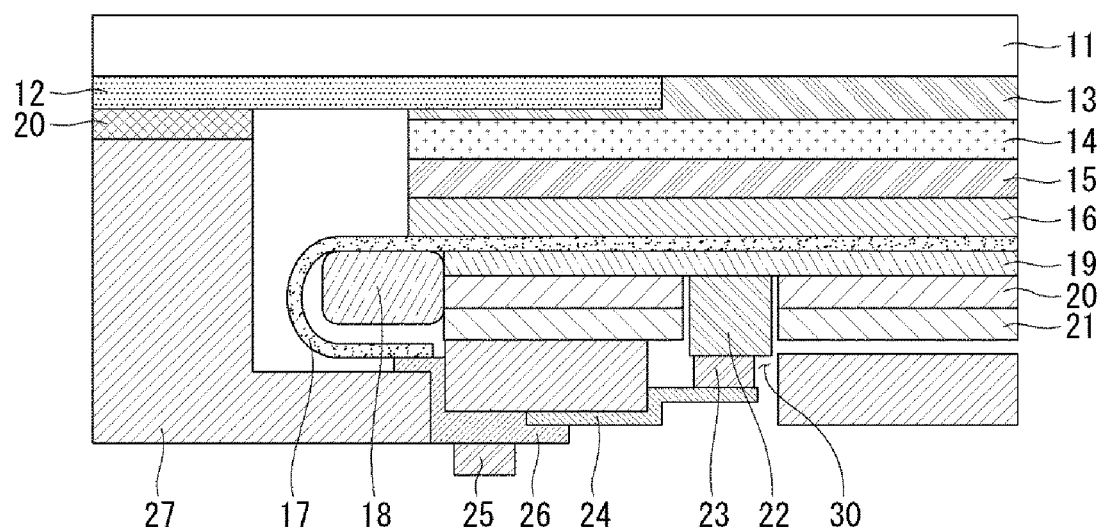
FIG. 6 is a cross-sectional view of a display device according to a fifth example embodiment of the present invention.

FIG. 6 is a cross-sectional view of a display device according to a fifth example embodiment of the present invention. Components substantially identical to those in the foregoing example embodiments are denoted by the same reference numerals, and detailed descriptions of them will be omitted, or may be briefly discussed.

Referring to FIG. 6, this example embodiment is substantially identical to the above first example embodiment, except that a hole exposing the position where the fingerprint sensor module 23 is situated is formed in the mid-frame 27. The metallic layer 21 has a hole for inserting the fingerprint sensor module 23.

Figure 7:
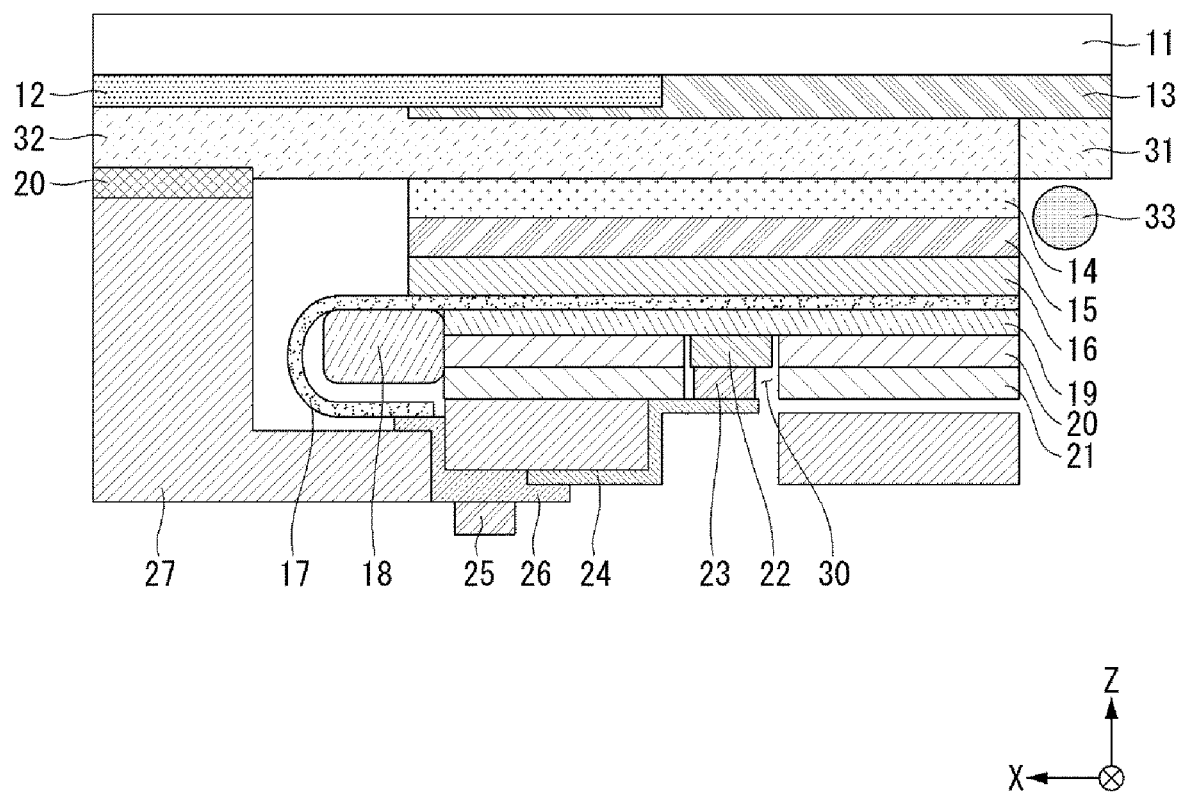
FIG. 7 is a cross-sectional view of a display device according to a sixth example embodiment of the present invention.

FIG. 7 is a cross-sectional view of a display device according to a sixth example embodiment of the present invention. Components substantially identical to those in the foregoing example embodiments are denoted by the same reference numerals, and detailed descriptions of them will be omitted, or may be briefly discussed.

Referring to FIG. 7, a display device of this invention further comprises a directional light controller 31, 32, and 33 placed between the transparent substrate 11 and the display panel 14, 15, 16, 17, and 19. The directional light controller 31, 32, and 33 comprises a light source 33, a light-entering element 31, and a light-exiting element 32. The directional light controller 31, 32, and 33 may further comprise a low refractive index layer. The directional light controller 31, 32, and 33 is substantially identical to those shown in FIGS. 2 and 5.

FIG. 8 is a cross-sectional view of a display device according to a seventh example embodiment of the present invention. Components substantially identical to those in the foregoing example embodiments are denoted by the same reference numerals, and detailed descriptions of them will be omitted, or may be briefly discussed.

Referring to FIG. 8, this example embodiment is substantially identical to the above third example embodiment, except that the first flexible substrate 24 and the second flexible substrate 26 are separated.

Figure 10:
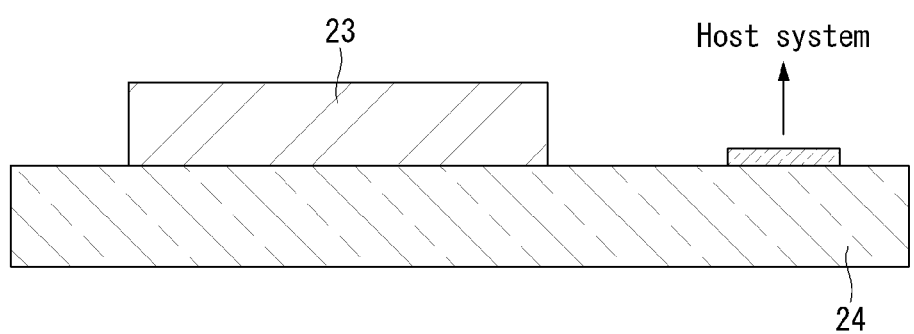
FIG. 10 is a cross-sectional view of an example in which a first flexible substrate shown in FIGS. 8 and 9 is connected to a host system's mainboard without via holes according to an example embodiment of the present invention.

The fingerprint sensor module 23 does not need to be connected to the drive IC 25. In this instance, the first flexible substrate 24 where the fingerprint sensor module 23 is mounted may be connected to the host system's mainboard without via holes like in FIG. 10.

FIG. 9 is a cross-sectional view of a display device according to an eighth example embodiment of the present invention. Components substantially identical to those in the foregoing example embodiments are denoted by the same reference numerals, and detailed descriptions of them will be omitted, or may be briefly discussed.

Referring to FIG. 9, a display device of this invention further comprises a directional light controller 31, 32, and 33 placed between the transparent substrate 11 and the display panel 14, 15, 16, 17, and 19. The directional light controller 31, 32, and 33 comprises a light source 33, a light-entering element 31, and a light-exiting element 32. The directional light controller 31, 32, and 33 may further comprise a low refractive index layer. The directional light controller 31, 32, and 33 is substantially identical to those shown in FIGS. 2 and 5.

Figure 11:
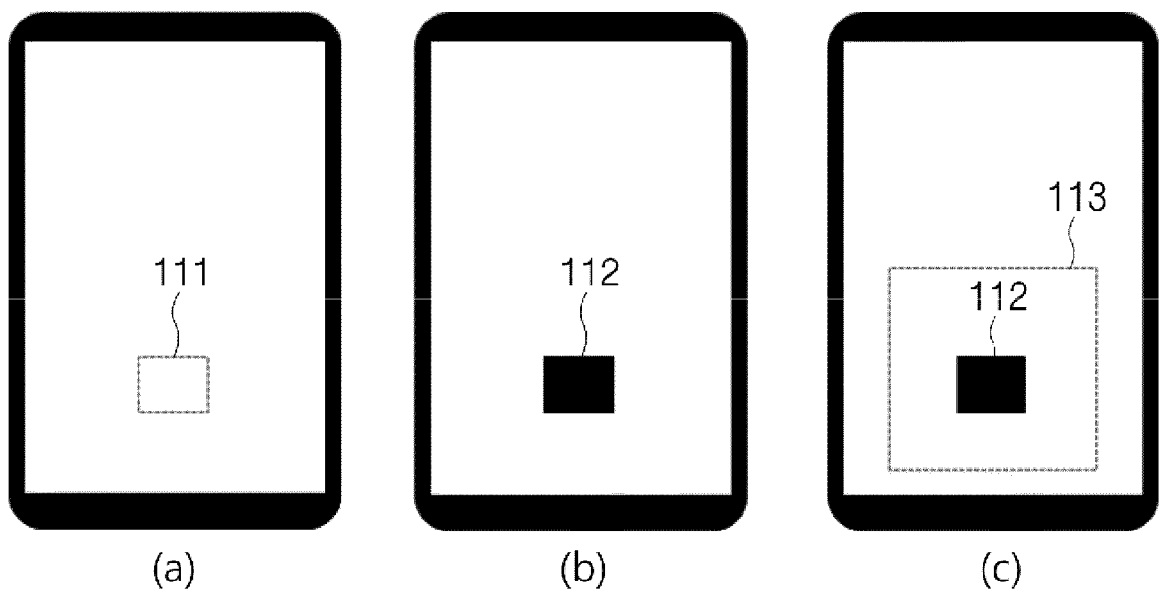
FIG. 11 is a plan view of a smartphone screen which shows an example of a fingerprint sensor situated on the screen and an example of a user interface method for indicating the fingerprint sensor's position according to an example embodiment of the present invention.

FIG. 11 is a plan view of a smartphone screen which shows an example of a fingerprint sensor situated on the screen and an example of a user interface method for indicating the fingerprint sensor's position.

Referring to FIG. 11, in a display device of this invention, the fingerprint sensor module 23 is situated under the pixel array 16 on which an input image displayed. In (a) of FIG. 11, the dotted line 111 indicates the position of a fingerprint sensor on the screen. When the user tries to unlock the smartphone through fingerprint recognition, the display device displays the position of the fingerprint sensor on the screen, as indicated by reference numeral "112" in (b) of FIG. 11. When the user touches the vicinity 113 of the fingerprint sensor module 23, the display device may display an image indicating the position 112 of the fingerprint sensor to allow the user to touch the screen on the fingerprint sensor, as shown in (c) of FIG. 11.

Figure 12:
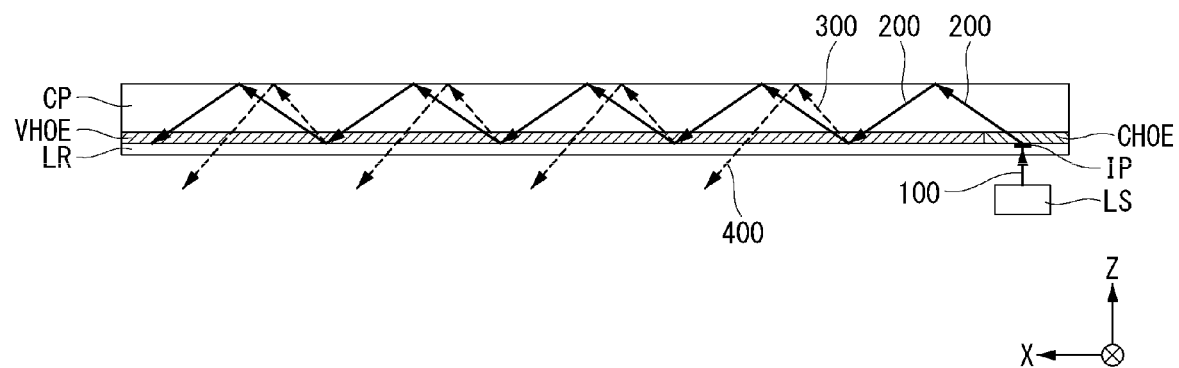
FIG. 12 illustrates a cross-sectional view and plan view of a directional light source device according to an example embodiment of the present invention.
Figure 12:
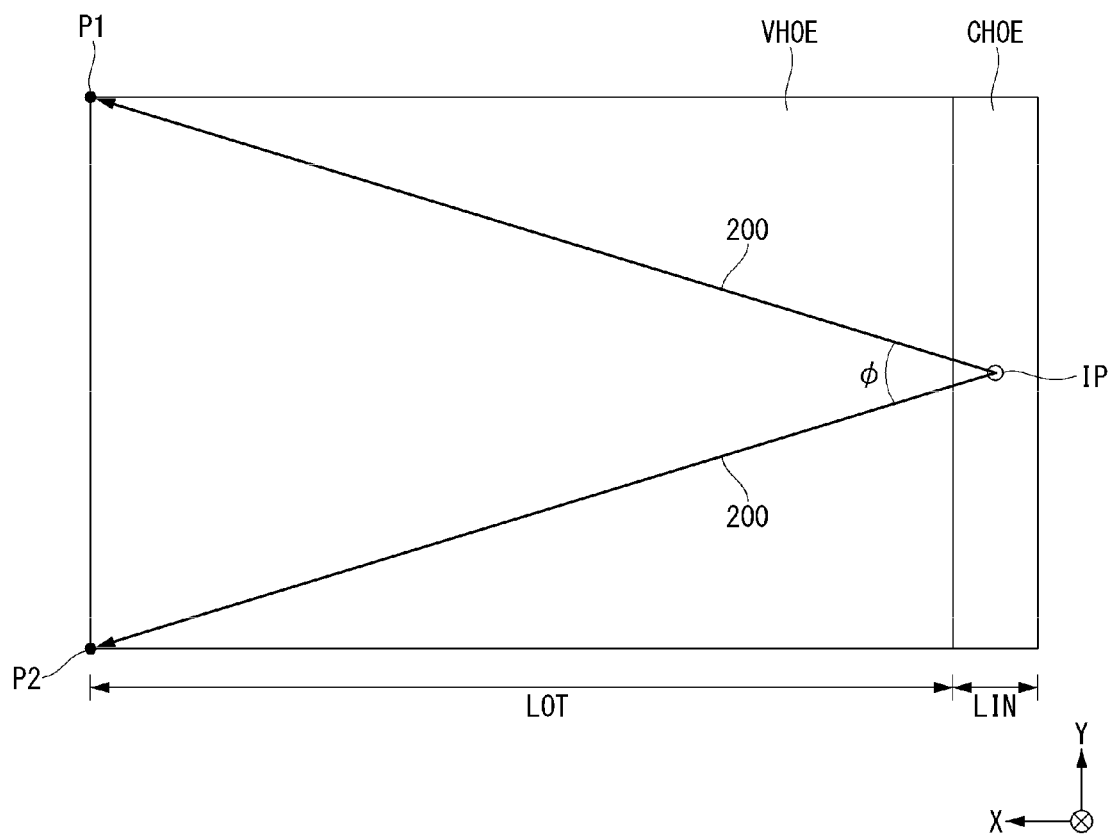
Figure 13:
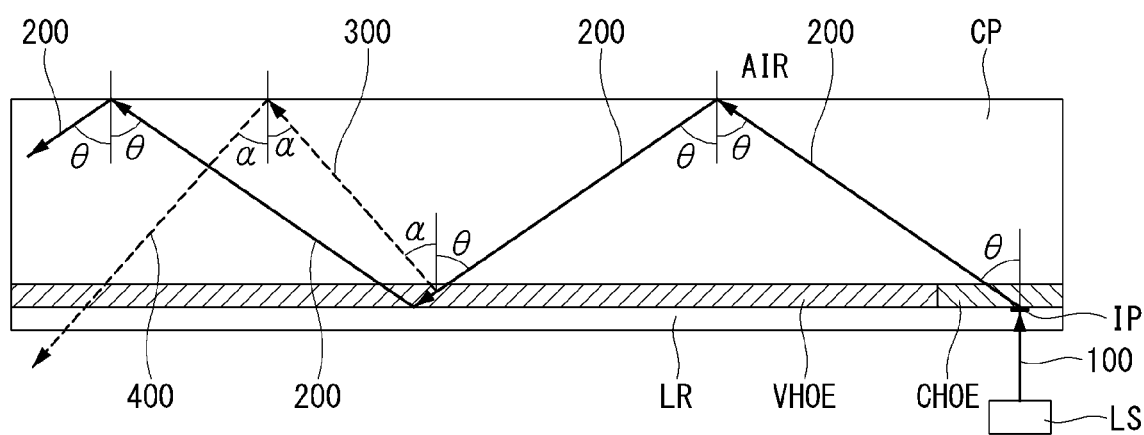
FIG. 13 is a plan view of a light path within a transparent substrate shown in FIG. 12 according to an example embodiment of the present invention.
Figure 14:
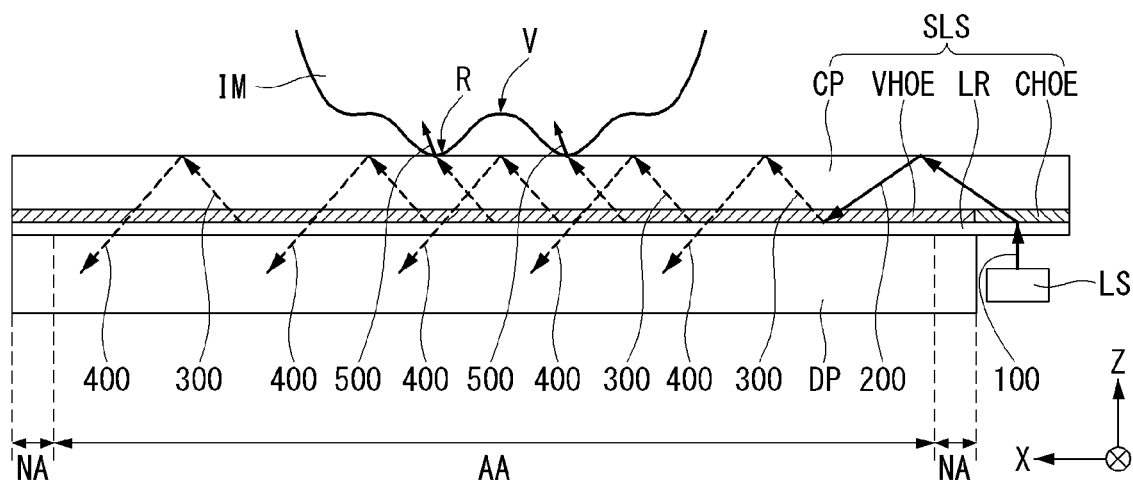
FIG. 14 illustrates a cross-sectional view and plan view of a directional light source device situated on a display panel according to an example embodiment of the present invention.
Figure 14:
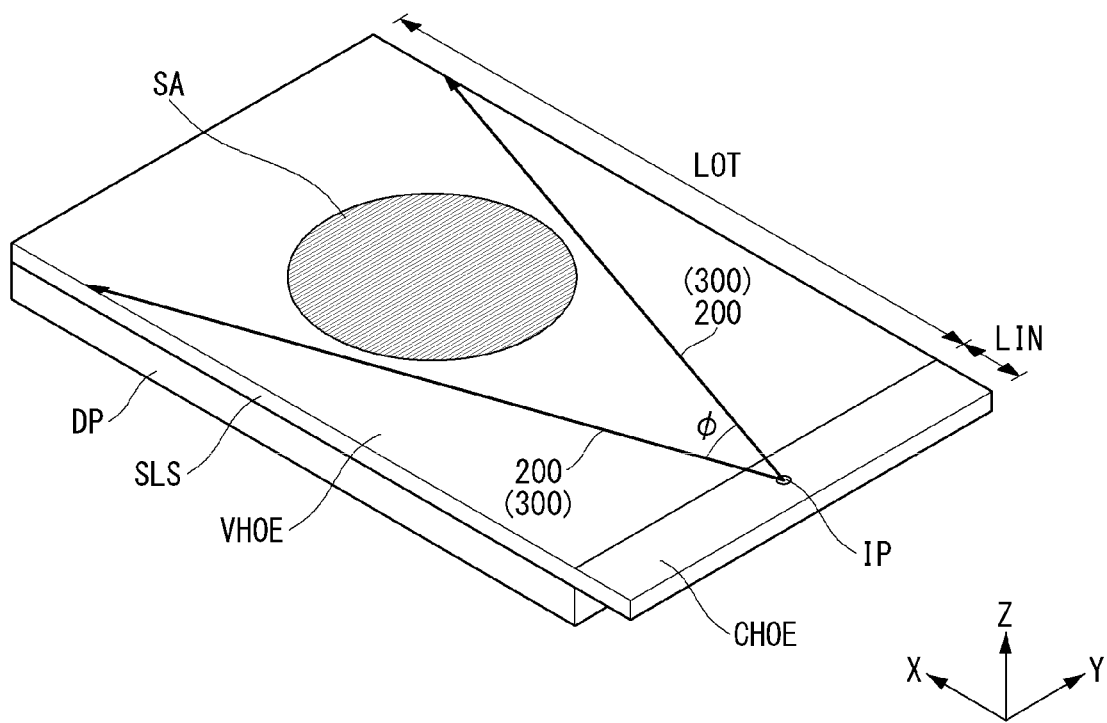

FIGS. 12 to 14 are views showing in detail the operation of the directional light source device that is applied in FIGS. 2, 5, 7, and 9.

FIG. 12 illustrates a cross-sectional view and plan view of a directional light source device SLS. FIG. 13 is a plan view of a light path within the transparent substrate CP shown in FIG. 12. FIG. 14 illustrates a cross-sectional view and plan view of a directional light source device SLS situated on a display panel DP.

Referring to FIG. 12, the directional light source device SLS comprises a transparent substrate CP and a directional light controller LS, CHOE, and VHOE that projects directional light to the transparent substrate CP. The transparent substrate CP may be implemented as, but not limited to, the transparent substrate 11 in the foregoing example embodiments. The directional light controller LS, CHOE, and VHOE may be implemented as, but not limited to, the light source 33, the light-entering element 31, and the light-exiting element 32, in the foregoing example embodiments. The directional light controller LS, CHOE, and VHOE may further comprise a low refractive index layer LR.

The directional light controller LS, CHOE, and VHOE is an optical device that scatters collimated light over a large area within the transparent substrate CP. It is desirable that the light source LS provides collimated light.

The light-exiting element VHOE and the light-entering element CHOE are bonded to the lower surface of the transparent substrate CP. The light-exiting element VHOE is an optical device that provides an outgoing beam 300. The receiving portion (or light receiving portion) of the optical fingerprint sensor is situated under the light-exiting element VHOE.

The light-entering element CHOE is an optical device that makes collimated light from the light source LS have directionality while it spread in the transparent substrate CP. The light-entering element CHOE may be situated on an edge of the display panel because it is not associated directly with image recognition. The light-entering element CHOE has to face the light source LS.

The light-exiting element VHOE and the light-entering element CHOE are situated on the same plane. To take the manufacturing process into consideration, it is desirable that the light-exiting element VHOE and the light-entering element CHOE are formed in separate areas on a single film. The light-exiting element VHOE and the light-entering element CHOE may be a hologram element to which a holographic pattern. In this instance, a master film with a pattern of the light-exiting element VHOE and a master film with a pattern of the light-entering element CHOE may be placed adjacent to each other, and then the two holographic patterns may be duplicated simultaneously on a single holographic recording film.

The low refractive index layer LR is placed between the elements VHOE and CHOE, and the display panel. The low refractive index layer LR has a lower refractive index than the transparent substrate CP and the light-exiting element VHOE.

The transparent substrate CP may be made with a transparent substrate with a refractive index of 1.5. The light-exiting element VHOE and the light-entering element CHOE are a transparent holographic recording film, whose refractive index may be equal to or slightly higher than that of the transparent substrate CP. Here, it is assumed that the refractive index of the light-exiting element VHOE and light-entering element CHOE is equal to the refractive index of the transparent substrate CP for convenience of explanation. Preferably, but not necessarily, the refractive index of the low refractive index layer LR is similar to the refractive index of a target fingerprint IM. For example, the low refractive index layer LR may have a refractive index of about 1.4, which is close to 1.39—the refractive index of the human skin.

The light source LS is placed opposite the light-entering element CHOE. It is desirable that the light source LS provides highly-collimated light as lasers do. When applied to a display device with built-in fingerprint recognition, the light source LS may provide infrared laser beams invisible to the user.

An incident beam 100 of collimated light from the light source LS has a given cross-sectional area and is provided to an incident point IP defined on the light-entering element CHOE. It is desirable that the incident beam 100 enters in a direction normal to the surface of the incident point IP. However, the present invention is not limited to this, and if necessary, the incident beam 100 may enter at an oblique angle from the direction normal to the surface of the incident point IP.

The light-entering element CHOE converts the incident beam 100 into a traveling beam 200 with an incident angle and sends it to the inside of the transparent substrate CP. Here, it is desirable that the incident angle is greater than the internal total reflection critical angle of the transparent substrate CP. As a result, the traveling beam 200 is totally reflected within the transparent substrate CP and travels along the X-axis corresponding to the length of the transparent substrate CP.

The light-exiting element VHOE converts some of the traveling beam 200 into an outgoing beam 300 and refracts it to the upper surface of the transparent substrate CP. The remaining part of the traveling beam 200 is totally reflected and travels within the transparent substrate CP. The outgoing beam 300 is totally reflected off the upper surface of the transparent substrate CP but passes through the low refractive index layer LR on the lower surface. That is, the outgoing beam 300 serves as a detection beam (or sensing beam) 400, which is totally reflected off the upper surface of the transparent substrate CP and passes through the lower surface.

The outgoing beam 300 is emitted gradually by the light-exiting element VHOE as it travels from the light-entering element CHOE. In this instance, the amount of light in the outgoing beam 300 is determined by the light extraction efficiency of the light-exiting element VHOE. For example, if the light extraction efficiency of the light-exiting element VHOE is 3%, 3% of the initial incident beam 100 is extracted as the outgoing beam 300, in a first light-emission region where the traveling beam 200 first touches the light-exiting element VHOE, while 97% of the initial incident beam as the traveling beam 200 continues to be totally reflected and travel. Afterwards, in a second light-emission region, 2.91% of the initial incident beam 100, which equals 3% of the remaining 97%, is extracted as the outgoing beam 300.

In this way, the outgoing beam 300 is extracted until it reaches the far edge of the transparent substrate CP. With such a uniform light extraction efficiency, the amount of light extraction decreases gradually as the traveling beam 200 travels further. In order to keep the amount of light in the outgoing beam 300 constant as the traveling beam 200 travels, it is desirable that the light extraction efficiency of the light-exiting element VHOE is designed to increase exponentially.

When viewed on the XZ plane (or 'vertical plane') consisting of axes along the length and thickness, the traveling beam 200 remains collimated as the incident beam 100 was. On the other hand, the traveling beam 200 preferably, but not necessarily, has a spread angle ((p) on the XY plane (or 'horizontal plane') consisting of axes along the length and width, in order to provide an image detection area corresponding to the area of the transparent substrate CP. For example, it is desirable that the light-exiting element VHOE is situated corresponding to the entire area of a light output portion LOT if possible. Also, the spread angle ((p) is equal to or greater than the interior angle of two line segments connecting from the incident point IP to two end points P1 and P2 on the other side of the transparent substrate CP opposite the light-entering element CHOE.

The region where the light-entering element CHOE is situated may be defined as a light input portion LIN. The region where the light-exiting element VHOE is situated may be defined as the light output portion LOT. Also, the light output portion LOT may be a light travel portion along which light travels.

For example, if the cross-sectional area of collimated light from the light source LS is 0.5 mm×0.5 mm, the light-entering element CHOE may have a length corresponding to the width of the transparent substrate CP and a width of around 3 mm to 5 mm. The light-entering element CHOE may be situated across the width of the transparent substrate CP.

Referring to FIG. 13, a description will be made about along which path within the transparent substrate CP a collimated infrared beam from a light source is converted into a directional infrared beam used for image detection.

The incident beam 100 from the light source LS enters in a direction normal to the surface of the incident point IP on the light-entering element CHOE. The light-entering element CHOE converts the incident beam 100 into a traveling beam 200 which is refracted at an incident angle (θ), and sends it to the inside of the transparent substrate CP.

Preferably, but not necessarily, the incident angle (θ) of the traveling beam 200 is greater than the total reflection critical angle TVHOE_LR at the interface between the light-exiting element VHOE and the low refractive index layer LR. For example, if the refractive index of the transparent substrate CP and the light-exiting element VHOE is 1.5 and the refractive index of the low refractive index layer LR is 1.4, the total reflection critical angle TVHOE_LR on the interface between the light-exiting element VHOE and the low refractive index layer LR is around 69 degrees. Accordingly, it is desirable that the incident angle (θ) is greater than 69 degrees. For example, the incident angle (θ) may be set to range from 70 to 75 degrees.

The traveling beam 200 is totally reflected off the upper surface of the transparent substrate CP since the upper surface of the transparent substrate CP is in contact with an air layer AIR. This is because the total reflection critical angle TCP_AIR at the interface between the transparent substrate CP and the air layer AIR is around 41.4 degrees. That is, as long as the incident angle (θ) is greater than the total reflection critical angle TVHOE_LR at the interface between the light-exiting element VHOE and the low refractive index layer LR, the incident angle (θ) is always greater than the total reflection critical angle TCP_AIR at the interface between the transparent substrate CP and the air layer AIR.

The light-exiting element VHOE converts a certain amount of light in the traveling beam 200 into an outgoing beam 300 having a reflection angle (a) and sends it back to the inside of the transparent substrate CP. The outgoing beam 300 is a beam for recognizing a pattern of a fingerprint IM touching the upper surface of the transparent substrate CP. If there is no object on the surface of the transparent substrate CP, the outgoing beam 300 has to be totally reflected and sent to the optical fingerprint sensor situated under the directional light source device SLS. The outgoing beam 300, after totally reflected off the upper surface of the transparent substrate CP, serves as a detection beam 400, which propagates under the directional light source device SLS.

The optical fingerprint sensor bonded to the underside of the display panel is capable of distinguishing a fingerprint pattern image on the transparent substrate CP by receiving the detection beam 400.

A display device according to the present invention comprises a directional light source device SLS and a display panel DP situated under the directional light source device SLS, as shown in FIG. 14. Specifically, such a display device may be implemented in the structures shown in FIGS. 2, 5, 7, and 9.

Referring to FIG. 14, an incident beam 100 is converted into a traveling beam 200 by the light-entering element CHOE. The traveling beam 200 is converted in such a way that it has a spread angle (φ) on the XY plane, which is a horizontal plane consisting of an X-axis along the length and a Y-axis along the width. Also, the traveling beam 200 remains collimated, as it originally was, on the XZ plane, which is a vertical plane consisting of an X-axis along the length and a Y-axis along the thickness.

Preferably, but not necessarily, the spread angle (φ) is equal to or greater than the interior angle of two line segments connecting from the incident point IP to two end points on the other side of the transparent substrate CP opposite the light-entering element CHOE. In this instance, the traveling beam 200 travels as it spreads out in a triangle with a spread angle (φ). As a result, an image sensing area may be within the triangle. Accordingly, when applied to a fingerprint recognition device, a sensing area SA may correspond to a striped circle.

If the sensing area SA is formed at the center of the display panel DP or at a part of the upper edge of the display panel DP, opposite the light-entering element CHOE, it is desirable that the amount of light in the outgoing beam 300 is largest in the sensing area SA. To this end, the light extraction efficiency of the light-exiting element VHOE may be designed as a function of position so that it is highest in the part corresponding to the sensing area SA and lowest or close to zero in the other parts.

Figure 15:
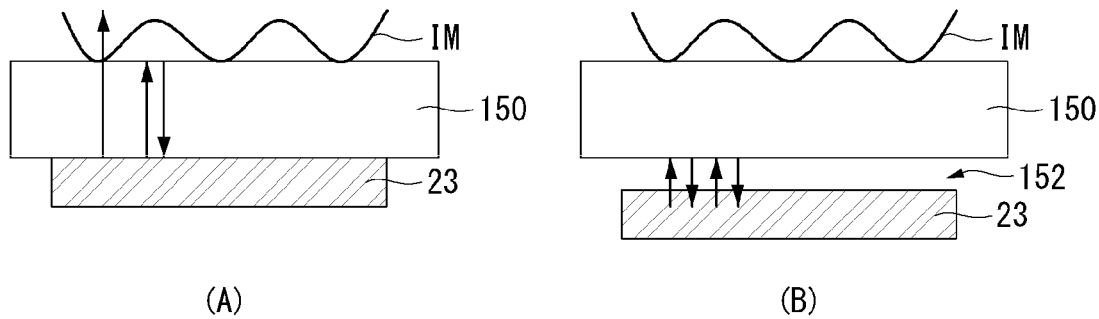
FIG. 15 is a view of an ultrasonic wave path which varies depending on the presence or absence of an air layer between a medium and an ultrasonic fingerprint sensor according to an example embodiment of the present invention.

FIG. 15 is a view of an ultrasonic wave path which varies depending on the presence or absence of an air layer between a medium and an ultrasonic fingerprint sensor. The medium 150 in FIG. 15 is a medium that comprises a transparent substrate, a light-exiting element, a low refractive index layer, and a display panel. If there is no air layer 152 in the medium 150, as shown in (A) of FIG. 15, an ultrasonic wave may pass through the medium 150 and be reflected off a fingerprint IM and received by the receiving portion of the ultrasonic fingerprint sensor. On the other hand, if there is an air layer 152 between the ultrasonic fingerprint sensor and the medium 150, as shown in (B) of FIG. 15, an ultrasonic wave from the ultrasonic fingerprint sensor does not reach as far as the fingerprint IM but is reflected off the surface of the medium 150 and therefore cannot sense a fingerprint pattern.

Figure 16:
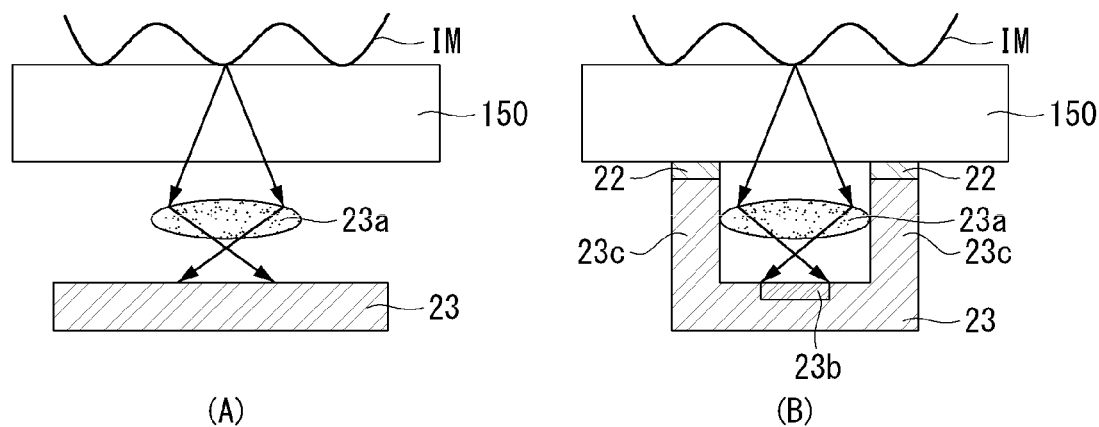
FIG. 16 is a view of a lens for improving the light reception efficiency of an optical fingerprint sensor according to an example embodiment of the present invention.

Similarly, in the instance of an optical fingerprint sensor 23, the light reception efficiency of the optical fingerprint sensor 23 is low if there is an air layer between the optical fingerprint sensor 23 and the medium 150, which reduces sensing performance. Meanwhile, if a lens 23a is placed in front of the receiving portion of the optical fingerprint sensor 23, as shown in (A) of FIG. 16, light is collimated by the lens 23a and directed onto the receiving portion, and therefore fingerprint sensing is possible even if there is an air layer in front of the receiving portion. As shown in (B) of FIG. 16, the lens 23a may be situated opposite the receiving portion 23b within a space provided by a cylindrical sidewall 23c in the optical fingerprint sensor 23. The top of the sidewall 23a is bonded to the display panel with an adhesive 22.

Figure 17:
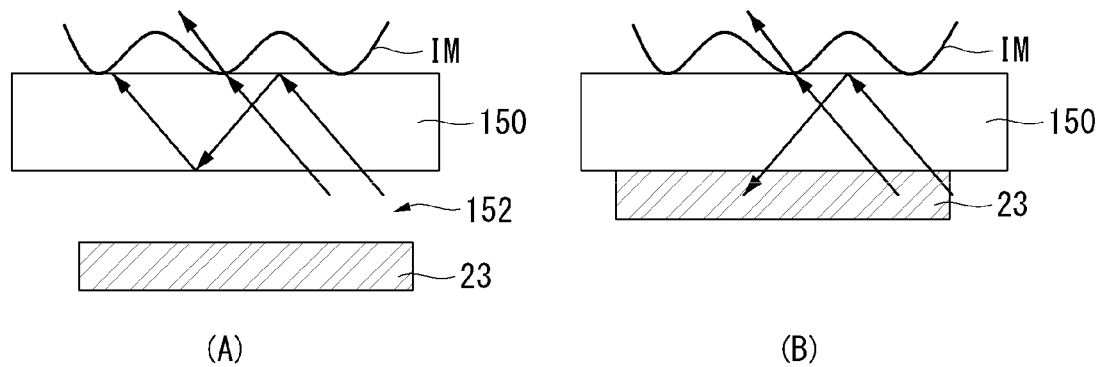
FIG. 17 is a view of a light path which varies depending on the presence or absence of an air layer between a transparent substrate medium and an optical fingerprint sensor in a directional light source device according to an example embodiment of the present invention.

FIG. 17 is a view of a light path which varies depending on the presence or absence of an air layer between a transparent substrate medium and an optical fingerprint sensor, in a directional light source device SLS by which light is totally reflected within a transparent substrate. When light is totally reflected within the medium 150, as shown in (A) of FIG. 17, no light is directed to the optical fingerprint sensor if there is an air layer 152 between the medium 150 and the optical fingerprint sensor 23, and therefore fingerprint sensing is not possible. Of course, by using the above-described low refractive index layer, some of the light may be directed to the optical fingerprint sensor 23 because of the air layer, but the presence of the air layer may reduce the light reception efficiency of the optical fingerprint sensor 23. When light is totally reflected within the medium 150, as shown in (B) of FIG. 17, the light is directed to the optical fingerprint sensor if there is no air layer 152 between the medium 150 and the optical fingerprint sensor 23, and therefore fingerprint sensing is possible.

In the present invention, as shown in FIGS. 1 to 9, the fingerprint sensor 23 is bonded to the display panel without an air layer, and the fingerprint sensor 23 is buried in the hole in the foam pad 20 and/or metallic layer 21 of the display panel. Accordingly, the present invention allows for accurate fingerprint sensing using the fingerprint sensor 23 since there is no air layer between a fingerprint on the transparent substrate 11 and the fingerprint sensor 23 and the distance between them can be reduced.

Figure 18:
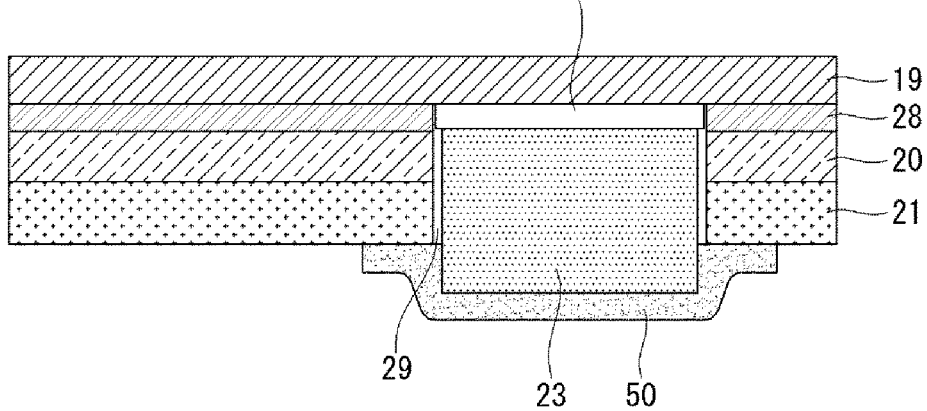
FIGS. 18 to 21 are views of non-transparent film.
Figure 19:
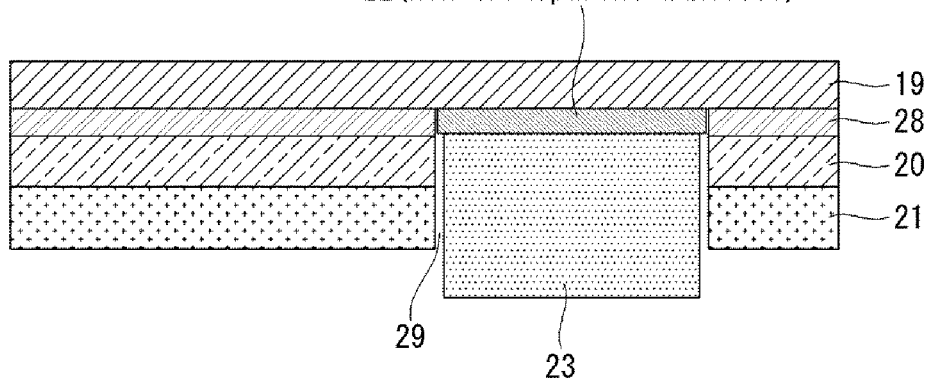
Figure 20:
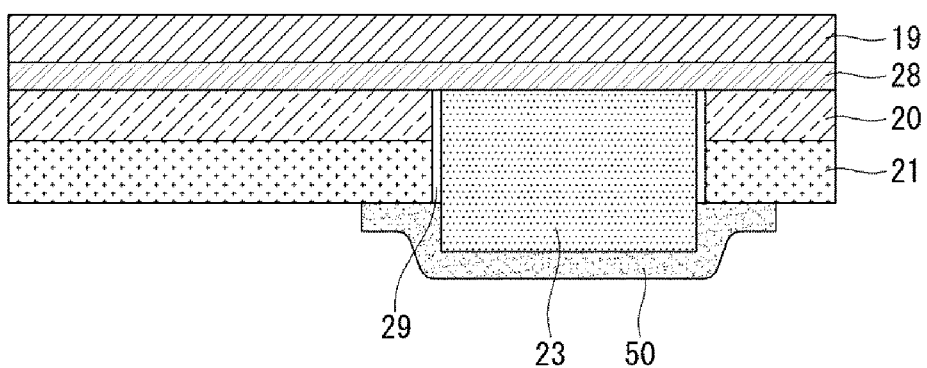

To bury the fingerprint sensor 23 in the display panel, a gap 29 may be provided between the foam pad 20 and metallic layer 21 and the fingerprint sensor 23, as shown in FIG. 18, due to the tolerance for the process of stamping the foam pad 20 and the metallic layer 21. This gap 29 may be seen on the screen displaying an image. An non-transparent film 50 may cover the fingerprint sensor 23 and the gap 29 around it, as shown in FIGS. 18 to 20, to keep the gap 29 from being visible. The non-transparent film 50 may be, but not limited to, a black or dark-colored film with an adhesive coated on one side.

Figure 21:
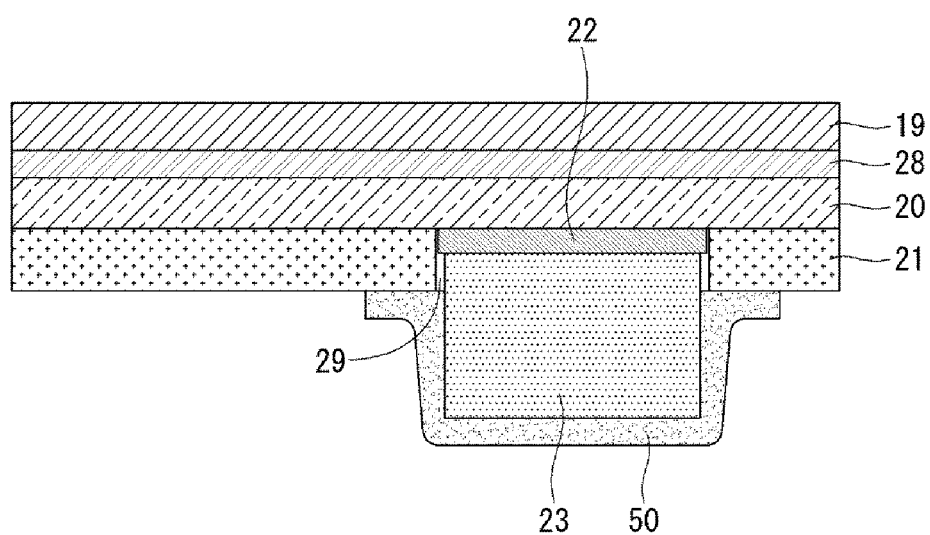

FIGS. 18 to 20 illustrate the non-transparent film 50 covering the fingerprint sensor 23 and the gap 29 around it, in the buried structure of the fingerprint sensor 23 shown in FIGS. 1 and 2. FIG. 21 illustrates the non-transparent film 50 covering the fingerprint sensor 23 and the gap 29 around it, in the buried structure of the fingerprint sensor 23 shown in FIGS. 4 and 5.

Referring to FIGS. 18 to 21, the non-transparent film 50 is bonded onto the metallic layer 21 and the fingerprint sensor 23 so as to cover the fingerprint sensor 23 and the gap 29 around it. The non-transparent film 50 may be a black or dark-colored adhesive film or resin.

The adhesive 22 for bonding the fingerprint sensor 23 onto the back plate 19 may be a transparent adhesive or an opaque adhesive. The opaque adhesive may be a colored adhesive. An example of the transparent adhesive may be transparent OCR, and an example of the colored adhesive may be a dark-colored or black OCR, but the present invention is not limited to them. When an opaque adhesive is used as the adhesive 22, the non-transparent film 50 may be omitted as shown in FIG. 19 because the opaque adhesive can substitute for the non-transparent film 50.

The foam pad 20 may be bonded to the back plate 19 with an adhesive 28 such as OCA. The fingerprint sensor 23 may be bonded to the back plate 19 using the same adhesive 28 as the foam pad 20, as shown in FIG. 20, rather than using a separate adhesive 22.

A UV pass filter for blocking light of visible wavelengths and passing UV light may be mixed in with the adhesives 22 and 28 opposite the receiving portion of the fingerprint sensor 23. In this case, there is no need to add a separate UV pass filter to the optical fingerprint sensor.

As discussed above, a display device according to the embodiment of the present invention can detect a fingerprint on a screen, without increasing bezel size or altering display panel structure, by placing a fingerprint sensor module under a pixel array with light-emitting diodes and bonding the fingerprint sensor module to the display panel. Moreover, the present invention can secure a path of ultrasonic waves or light between a transparent substrate where a fingerprint touches and the fingerprint sensor module by forming a hole in a metallic layer for blocking electromagnetic interference EMI and inserting the fingerprint sensor module in the hole.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a transparent substrate;
   a display panel configured to be situated under the transparent substrate and display an image on a display area toward the transparent substrate;
   a fingerprint sensor under the display panel to detect a fingerprint contacting the transparent substrate;
   a drive integrated circuit (drive IC) configured to drive the display panel;
   a foam pad under the display panel;
   a metallic layer under the display panel with the foam pad interposed therebetween;
   a frame configured to accommodate the display panel and the fingerprint sensor, and expose the drive IC;
   a first flexible substrate having one end on which the fingerprint sensor is directly disposed; and
   a second flexible substrate on which the drive IC is directly disposed, and having one end connected with one end of an organic thin film of the display panel inside of the frame.

2. The display device of claim 1, further comprising:
   a non-transparent film configured to be situated under the fingerprint sensor.

3. The display device of claim 2,
wherein the metallic layer comprises a hole exposing the foam pad, and the fingerprint sensor bonded to a surface of the foam pad in the hole.

4. The display device of claim 3, wherein the non-transparent film configured to cover the hole under the fingerprint sensor.

5. The display device of claim 2,
wherein the foam pad and the metallic layer comprise a hole exposing the display panel, and the fingerprint sensor is bonded to a surface of the display panel in the hole.

6. The display device of claim 5, wherein the non-transparent film configured to cover the hole under the fingerprint sensor.

7. The display device of claim 5, wherein the fingerprint sensor is separated from the foam pad and the metallic layer.

8. The display device of claim 1, wherein the fingerprint sensor is disposed on the display panel in an opposite side of a contact position of fingerprint with the substrate therebetween.

9. The display device of claim 1, wherein the fingerprint sensor comprises one of an ultrasonic fingerprint sensor or an optical fingerprint sensor.

10. The display device of claim 1, further comprising:
a light-entering element on one edge of the display panel;
a light-exiting element in the display area of the display panel; and
a light source that is placed opposite the light-entering element and projects light to the light-entering element.

11. The display device of claim 10, wherein each of the light-entering element and the light-exiting element comprises a holographic pattern.

12. The display device of claim 1, wherein the display panel comprises:
a pixel array on the organic thin film, and having a plurality of pixels respectively comprising light-emitting diodes;
a touch sensor array on the pixel array;
a polarizing film on the touch sensor array; and
a back plate under the organic thin film.

13. The display device of claim 12,
wherein the second flexible substrate has another end connected with another end of the first flexible substrate.

14. The display device of claim 13, further comprising a mandrel, wherein one end of the organic thin film has a bent portion that is bent and connected to the second flexible substrate, and the mandrel supports the bent portion of the organic thin film.

15. The display device of claim 1, wherein a position of the fingerprint sensor is displayed on a screen of the display panel.

16. The display device of claim 1, further comprising a lens placed in front of a receiving portion of the fingerprint sensor.

17. The display device of claim 1, wherein the frame has a sidewall that is bonded to the transparent substrate by another foam pad.

18. The display device of claim 1, wherein the fingerprint sensor is bonded to a surface of the display panel by an adhesive.

19. The display device of claim 18, wherein the adhesive is non-transparent.

20. The display device of claim 1, further comprising a decorative film overlapping the display panel,
wherein the fingerprint sensor is aligned with an edge of the decorative film overlapping the display panel when viewed in a side elevation view.

* * * * *